(12) United States Patent (10) Patent No.: US 8,314,425 B2
Iwasaki et al. (45) Date of Patent: Nov. 20, 2012

(54) FIELD-EFFECT TRANSISTOR USING AMORPHOUSE OXIDE

(75) Inventors: Tatsuya Iwasaki, Machida (JP); Amita Goyal, Tokyo (JP); Naho Itagaki, Fukuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 231 days.

(21) Appl. No.: 12/747,601

(22) PCT Filed: Jan. 20, 2009

(86) PCT No.: PCT/JP2009/051144
§ 371 (c)(1),
(2), (4) Date: Jun. 11, 2010

(87) PCT Pub. No.: WO2009/093724
PCT Pub. Date: Jul. 30, 2009

(65) Prior Publication Data
US 2010/0264419 A1 Oct. 21, 2010

(30) Foreign Application Priority Data
Jan. 23, 2008 (JP) ................................. 2008-012592

(51) Int. Cl.
*H01L 29/04* (2006.01)
(52) U.S. Cl. .............................. 257/59; 257/72; 257/258
(58) Field of Classification Search .................... 257/59, 257/72, 258
See application file for complete search history.

(56) References Cited

U.S. PATENT DOCUMENTS

| 5,593,335 | A | 1/1997 | Suzuki et al. | 445/50 |
|---|---|---|---|---|
| 6,160,347 | A | 12/2000 | Iwasaki et al. | 313/545 |
| 6,231,412 | B1 | 5/2001 | Kawade et al. | 445/3 |
| 6,838,308 | B2 | 1/2005 | Haga | 438/104 |
| 6,936,854 | B2 | 8/2005 | Iwasaki et al. | 257/81 |
| 6,970,610 | B2 | 11/2005 | Iwasaki | 385/14 |
| 7,145,174 | B2 | 12/2006 | Chiang et al. | 257/59 |
| 7,189,992 | B2 | 3/2007 | Wager, III et al. | 257/43 |
| 7,242,039 | B2 | 7/2007 | Hoffman et al. | 257/213 |
| 7,282,782 | B2 | 10/2007 | Hoffman et al. | 257/613 |
| 7,297,977 | B2 | 11/2007 | Hoffman et al. | 257/43 |
| 7,411,209 | B2 | 8/2008 | Endo et al. | 257/43 |
| 7,473,942 | B2 | 1/2009 | Iwasaki et al. | 257/103 |
| 7,569,856 | B2 * | 8/2009 | Konuma et al. | 257/66 |
| 7,791,074 | B2 | 9/2010 | Iwasaki | 257/52 |
| 7,956,361 | B2 | 6/2011 | Iwasaki | 257/66 |

(Continued)

FOREIGN PATENT DOCUMENTS

JP 2008-243928 A 10/2008
(Continued)

OTHER PUBLICATIONS

Office Action dated Sep. 8, 2011, issued in counterpart Chinese application 200980103002.0, with translation.
K. Nomura, et al., "Room-temperature fabrication of transparent flexible thin-film transistors using amorphous oxide semiconductors," Nature, vol. 432, pp. 488-492, Nov. 25, 2004.

(Continued)

*Primary Examiner* — Tan N Tran
(74) *Attorney, Agent, or Firm* — Fitzpatrick, Cella, Harper & Scinto

(57) ABSTRACT

A field-effect transistor includes at least a channel layer, a gate insulating layer, a source electrode, a drain electrode, and a gate electrode, which are formed on a substrate. The channel layer is made of an amorphous oxide material that contains at least In and B, and the amorphous oxide material has an element ratio $B/(In+B)$ of 0.05 or higher and 0.29 or lower.

10 Claims, 9 Drawing Sheets

U.S. PATENT DOCUMENTS

| | | |
|---|---|---|
| 2006/0110867 A1 | 5/2006 | Yabuta et al. ............ 438/151 |
| 2006/0113565 A1 | 6/2006 | Abe et al. ............ 257/197 |
| 2007/0194379 A1* | 8/2007 | Hosono et al. ............ 257/347 |
| 2008/0001538 A1 | 1/2008 | Cok ............ 313/506 |
| 2009/0065771 A1 | 3/2009 | Iwasaki et al. ............ 257/43 |
| 2009/0134427 A1 | 5/2009 | Oike et al. ............ 257/103 |
| 2009/0174012 A1 | 7/2009 | Iwasaki ............ 257/410 |
| 2009/0189153 A1 | 7/2009 | Iwasaki et al. ............ 257/43 |
| 2009/0269880 A1 | 10/2009 | Itagaki et al. ............ 438/104 |
| 2010/0092800 A1 | 4/2010 | Itagaki et al. ............ 428/697 |
| 2010/0109002 A1 | 5/2010 | Itagaki et al. ............ 257/43 |
| 2010/0224870 A1 | 9/2010 | Iwasaki et al. ............ 257/43 |

FOREIGN PATENT DOCUMENTS

| | | |
|---|---|---|
| JP | 2008-342929 A | 10/2008 |
| WO | WO 2007/029844 A1 | 3/2007 |
| WO | WO 2007/086291 A1 | 8/2007 |

OTHER PUBLICATIONS

R.E. Presley et al., "Transparent ring oscillator based on indium gallium oxide thin-film transistors," Solid-State Electronics, vol. 50, pp. 500-503, Mar. 31, 2006.

B. Yaglioglu et al., "High-mobility amorphous $In_2O_3$-10 wt % ZnO thin film transistors," Applied Physics Letters, vol. 89, pp. 062103-1-062103-3, Aug. 7, 2006.

P. Barquinha et al., "Effect of UV and visible light radiation on the electrical performances of transparent TFTs based on amorphous indium zinc oxide," Journal of Non-Crystalline Solids, vol. 352, pp. 175601760, Apr. 18, 2006.

Office Action dated Nov. 20, 2011, issued in counterpart Korean Application No. 10-2010-7017793, with translation.

* cited by examiner

A) B/(In+B)=0.10
B) B/(In+B)=0.16
C) B/(In+B)=0.22
D) B/(In+B)=0.29

FIELD-EFFECT TRANSISTOR USING AMORPHOUSE OXIDE

TECHNICAL FIELD

The present invention relates to a field-effect transistor using an amorphous oxide.

BACKGROUND ART

Field-effect transistors (FETs) include a gate electrode, a source electrode, and a drain electrode, and are electronic active devices that control electric current between the source electrode and the drain electrode by controlling the flow of electric current into a channel layer through voltage application to the gate electrode. FETs that use as the channel layer a thin film deposited on an insulated substrate such as a ceramic, glass, or plastic substrate, in particular, are called thin film transistors (TFTs).

The above-mentioned TFTs are formed by using a thin film technology, and hence the TFTs have an advantage of being easily formed on a substrate having a relatively large area, and therefore are widely used as a driving device for a flat panel display such as a liquid crystal display. Specifically, an active liquid crystal display (ALCD) turns on/off each image pixel by using TFTs formed on a glass substrate. Further, for a future high performance organic LED display (OLED), it is effective to control current of each pixel by TFTs. In addition, a liquid crystal display having a higher performance is realized in which peripheral circuits having a function of driving and controlling an entire image is formed on a substrate in the vicinity of an image area by using TFTs.

The most popular TFTs at present are ones that employ a polycrystalline silicon film or an amorphous silicon film as a channel layer material. Amorphous silicon TFTs for pixel driving and high performance polycrystalline silicon TFTs for overall image driving/controlling have been put into practical use.

A drawback of TFTs developed in the past, including amorphous silicon TFTs and polysilicon TFTs, is that a high-temperature process is required in manufacturing those devices, which makes it difficult to form the TFTs on a plastic plate, a film, or other similar substrates.

Meanwhile, the development of flexible displays in which a TFT formed on a resin substrate such as a polymer plate or a film serves as a drive circuit of an LCD or of an OLED has become active in recent years. This draws attention to organic semiconductor films, which can be deposited at low temperatures and have electrical conductivity, as a material that can be deposited on a plastic film or the like.

Pentacene is an example of organic semiconductor films, and its research and development is being advanced. It has been reported that the carrier mobility of pentacene is about 0.5 $cm^2$/Vs, which is equivalent to the carrier mobilities of amorphous Si TFTs.

However, pentacene and other organic semiconductors have problems of being low in thermal stability (<150° C.), and have not succeeded in producing a device usable in practical uses.

Another material that has recently been drawing attention as being applicable to the channel layer of a TFT is an oxide material. For example, TFTs using as the channel layer a transparent conductive oxide polycrystalline thin film having ZnO as a major component are being developed actively. This thin film can be deposited at relatively low temperatures and formed on a plastic plate, a film, or other similar resin substrates. However, in general, a compound having ZnO as a major component cannot form a stable amorphous phase at room temperature and forms a polycrystalline phase instead, which causes electron scattering in the polycrystalline grain boundaries and makes it difficult to increase the electron mobility. In addition, electrical properties of such a polycrystalline compound is greatly influenced by shape and interconnection of polycrystalline grains, which could depend on the fabrication process of a film deposition condition etc., and hence resultant TFT devices have fluctuating characteristics in some cases.

With regard to this problem, a thin film transistor that uses an In—Ga—Zn—O-based amorphous oxide has been reported in K. Nomura et al., Nature vol. 432, pp. 488-492 (2004-11). This transistor can be formed on a plastic or glass substrate at room temperature. The transistor also accomplishes the characteristics of a normally-off transistor at a field-effect mobility of about 6 to 9. Another advantageous characteristic is that the transistor is transparent with respect to visible light. Specifically, the above-mentioned document describes a technique of using an amorphous oxide that has a composition ratio of In:Ga:Zn=1.1:1.1:0.9 (atomic ratio) for the channel layer of a TFT.

While an amorphous oxide using three metal elements In, Ga, and Zn is employed in the above-mentioned document, it is better in terms of ease of composition control and material adjustment that a smaller number of metal elements are used.

On the other hand, oxides that use one type of metal element, such as ZnO and $In_2O_3$, generally form polycrystalline thin films when deposited by sputtering or a similar method, and accordingly are likely to cause fluctuations in characteristics of a TFT device as described above.

Results of study on an In—Zn—O-based amorphous oxide as an example of using two types of metal elements have been known from the report in Applied Physics Letters 89, 062103 (2006). However, it has been known that the resistivity of an In—Zn—O-based amorphous oxide could be varied when the oxide is stored in atmospheric air, and thus improving the environmental is desired.

In addition, results of study on an In—Zn—O-based amorphous oxide have been reported in Solid-State Electronics, 50 (2006), pp. 500-503. In this report, heat treatment of 500° C. is performed, and hence it is desirable to manufacture a device at lower temperatures. This is because, if the device can be manufactured at low temperatures, an inexpensive glass substrate or resin substrate can be used.

Therefore, an amorphous oxide which is comprised of a smaller number of metal elements and has excellent stability is desired in the field of the thin film transistors.

DISCLOSURE OF THE INVENTION

The present invention has been made in view of the above-mentioned problems, and it is therefore an object of the present invention to provide a field-effect transistor that uses an amorphous oxide which is comprised of a small number of elements and exhibits a larger on/off ratio. Further, it is another object of the present invention to provide a field-effect transistor that has an excellent environmental stability to storage in atmospheric air.

A field-effect transistor according to the present invention comprises at least a channel layer, a gate insulating layer, a source electrode, a drain electrode, and a gate electrode, which are formed on a substrate, wherein the channel layer is made of an amorphous oxide material that contains at least In (indium) and B (boron), and wherein the amorphous oxide material has an element ratio B/(In+B) of 0.05 or higher and 0.29 or lower.

Further, a field-effect transistor according to the present invention comprises at least a channel layer, a gate insulating layer, a source electrode, a drain electrode, and a gate electrode, which are formed on a substrate, wherein the channel layer is made of an amorphous oxide material that contains at least In, Zn, and B, and wherein an element ratio B/(In+Zn+B) of the amorphous oxide material is 0.05 or higher and 0.29 or lower.

Further, a display according to the present invention comprises: the field-effect transistor; and at least one pixel device having an electrode connected with one of the source electrode and the drain electrode of the field-effect transistor.

According to the present invention, the channel layer is made of a novel material such as an amorphous oxide containing indium and boron, and hence a thin film transistor exhibiting good characteristics can be realized. In particular, the present invention achieves such an effect that transistor characteristics including the on/off ratio and the S value are excellent and environmental stability is good.

BRIEF DESCRIPTION OF THE DRAWINGS

FIGS. 3A and 3B are graphs illustrating characteristic comparisons among an In—B—O-based field-effect transistor, an In—Al—O-based field-effect transistor, and an In—Ga—O-based field-effect transistor, in which FIG. 3A illustrates on/off ratios to be compared and FIG. 3B illustrates S values to be compared.

BEST MODE FOR CARRYING OUT THE INVENTION

An exemplary embodiment mode for embodying the present invention is described.

Figure 2:
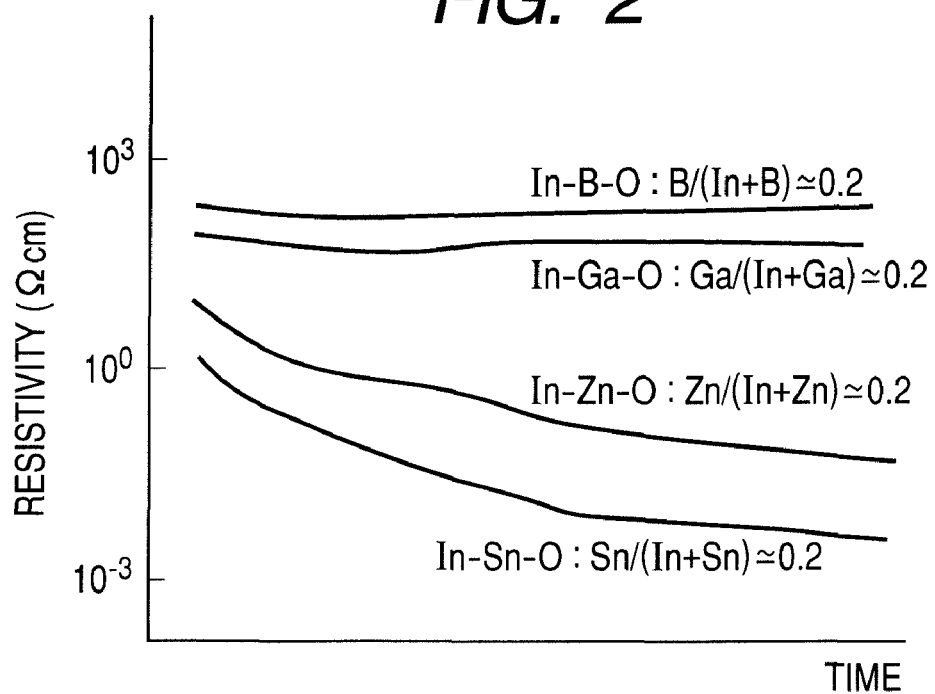
FIG. 2 is a graph illustrating temporal change in resistivity of an In—B—O-based field-effect transistor.

The inventors of the present invention have earnestly studied an oxide material containing two types of metal elements, such as an oxide containing indium (In) and boron (B), as a material of a channel layer of a thin film transistor. FIG. 2 illustrates temporal changes in resistivities of various oxide thin films formed by sputtering. In FIG. 2, each of the thin films used has an element ratio M/(In+M), between In and another metal element M, of approximately 0.2. As is apparent from FIG. 2, the temporal change in resistivity of each of an oxide containing In and Zn (In—Zn—O) and an oxide containing In and Sn (In—Sn—O) is large. In contrast to this, it is apparent that the temporal change in resistivity of each of an oxide containing In and B (In—B—O) and an oxide containing In and Ga (In—Ga—O) hardly occurs. The oxide (In—B—O) has excellent environmental stability in electrical properties and thus is a desirable semiconductor material.

Next, the materials described above were used for channels to manufacture prototypes of thin film transistors. In the case of each of the oxide (In—Zn—O) and the oxide (In—Sn—O), it was difficult to realize a transistor having an on/off ratio equal to or larger than five orders of magnitude. In contrast to this, in the case of the oxide (In—B—O), as is apparent from the transfer characteristic (Id-Vg graph) illustrated in FIG. 1, it was possible to realize a transistor having an on/off ratio equal to or larger than ten orders of magnitude.

Figure 3A:
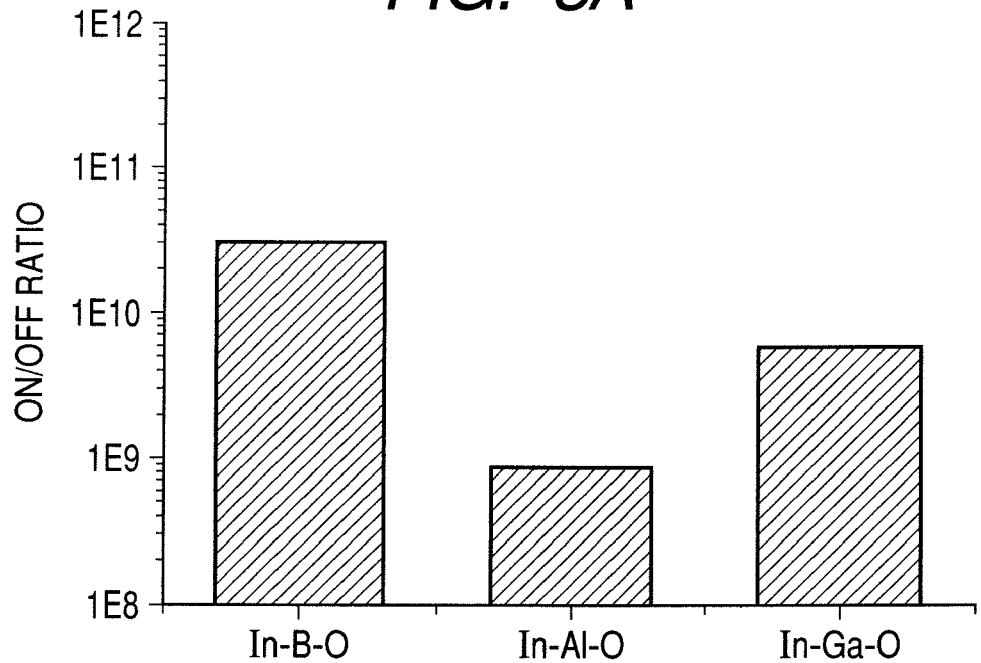
Figure 3B:
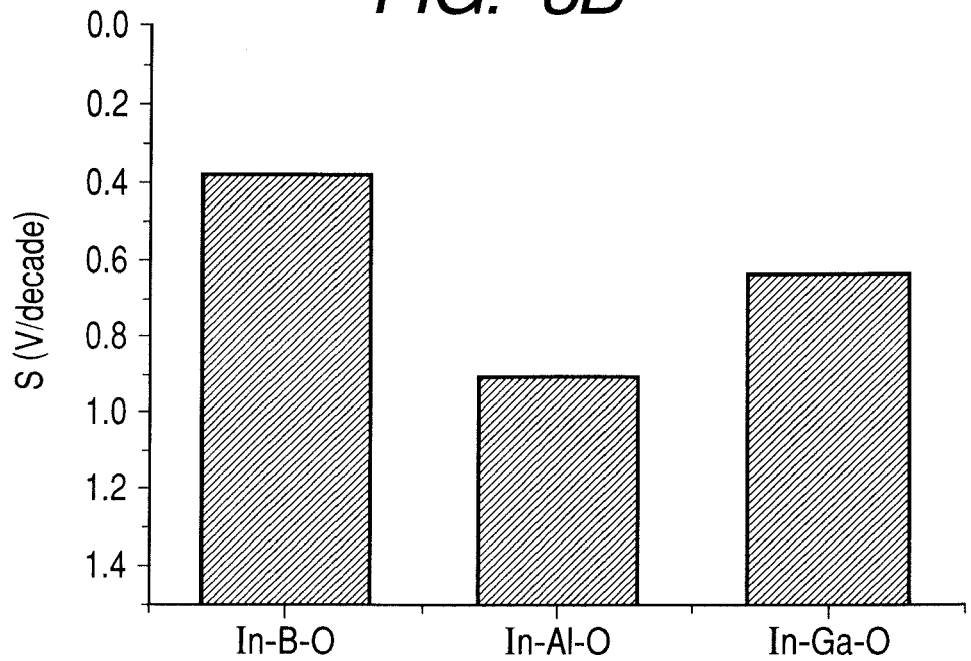

FIGS. 3A and 3B are graphs in which transistor characteristics at a time when the oxides of In—M—O (metal element M is a group III element of the periodic table) are used for channels are compared with one another. As illustrated in FIG. 3A, a thin film transistor (TFT) including a channel containing In—B—O exhibits a larger on/off ratio than a TFT including a channel containing In—Ga—O and a TFT including a channel containing In—Al—O. As illustrated in FIG. 3B, the TFT including the channel containing In—B—O exhibits a smaller S value than the TFT including the channel containing In—Ga—O and the TFT including the channel containing In—Al—O. Therefore, the TFT using In—B—O for the channel exhibits desirable transistor characteristics.

Next, an embodiment of a field-effect transistor according to the present invention is described in detail.

First, a structure of the field-effect transistor according to this embodiment is described.

Figure 8A:
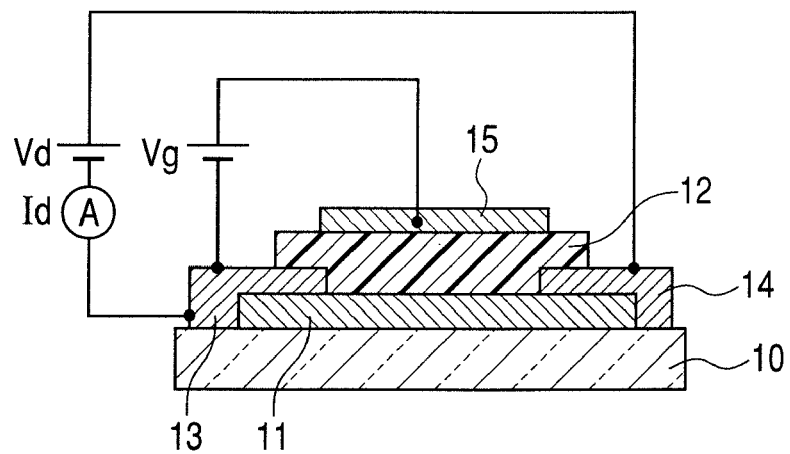
FIGS. 8A, 8B, and 8C are cross-sectional views illustrating structural examples of a field-effect transistor according to an embodiment of the present invention.
Figure 8B:
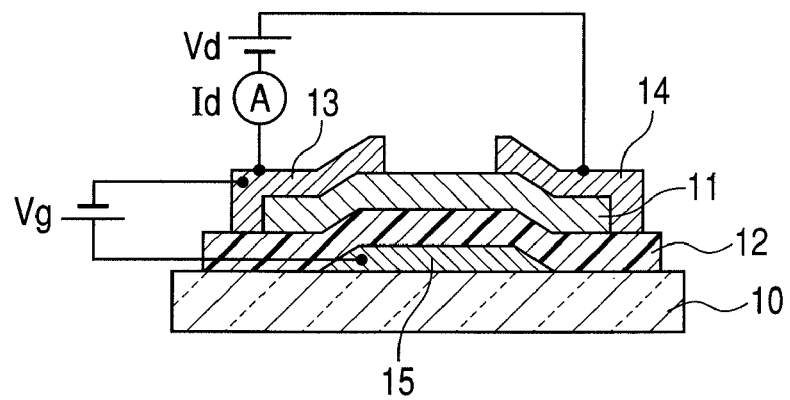
Figure 8C:
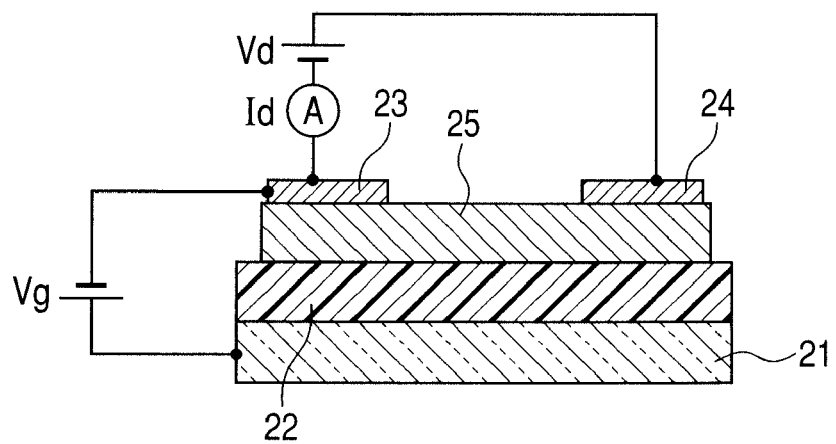

FIGS. 8A, 8B, and 8C are cross-sectional views illustrating structural examples of the field-effect transistor according to this embodiment. In FIGS. 8A, 8B, and 8C, a substrate, a channel layer, a gate insulating layer, a source electrode, a drain electrode, and a gate electrode are denoted by reference numerals 10, 11, 12, 13, 14, and 15, respectively.

The field-effect transistor according to this embodiment is a three-terminal device including the gate electrode 15, the source electrode 13, and the drain electrode 14. The field-effect transistor has a function of applying a voltage Vg to the gate electrode, controlling a current Id flowing through the channel layer, and switching the current Id between the source electrode and the drain electrode.

FIG. 8A illustrates an example of a top-gate structure in which the gate insulating layer 12 and the gate electrode 15 are sequentially formed on the semiconductor channel layer 11. Further, FIG. 8B illustrates an example of a bottom-gate structure in which the gate insulating layer 12 and the semiconductor channel layer 11 are sequentially formed on the gate electrode 15. Further, FIG. 8C illustrates another example of the bottom-gate transistor. In FIG. 8C, a substrate ($n^+$ Si substrate which doubles as a gate electrode), an insulating layer ($SiO_2$), a channel layer (oxide), a source electrode, and a drain electrode are denoted by reference numerals 21, 22, 25, 23, and 24, respectively.

The structure of the field-effect transistor is not limited to the above-mentioned structure in the present invention, and an arbitrary top/bottom gate structure or staggered/inverse staggered structure may be used.

Components constituting the field-effect transistor of this embodiment are described next in more detail.

(Channel Layer)

The field-effect transistor of this embodiment, as described above, is characterized by using for the channel layer an amorphous oxide that contains at least indium and boron. An amorphous oxide containing In and B (In—B—O) and an amorphous oxide containing In, B, and Zn (In—Zn—B—O) are especially desirable materials. An amorphous oxide containing In, Sn, and B is employable as well.

In this embodiment, the ratio of boron with respect to all the metal elements contained in the amorphous oxide is equal to or larger than 10 atom % and equal to or smaller than 40 atom %. The amorphous oxide made of In—B—O contains, of all the elements, a largest amount of oxygen, a second largest amount of indium, and a third largest amount of boron. The amorphous oxide made of In—Zn—B—O contains, of all the elements, a largest amount of oxygen, a second largest amount of zinc (or indium), a third largest amount of indium (or zinc), and a fourth largest amount of boron.

The inventors of the present invention found out the following during the earnest study on the thin film transistor using the amorphous oxide containing indium and boron for the channel layer. That is, when an oxide semiconductor having a specific element ratio B/(In+B) is applied to the channel, a transistor exhibiting desirable characteristics can be realized.

In employing In—B—O for the channel of a thin film transistor, there is a preferable In and B element ratio. The preferable element ratio B/(In+B) is 0.05 (5 atom %) or higher, because, at this element ratio, an amorphous thin film can be obtained by sputter-deposition with the substrate temperature kept at room temperature. This is because, as described above, the polycrystalline phase in which shape and interconnection of polycrystalline grains are greatly varied depending on a film deposition method causes fluctuations in characteristics of a TFT device.

Figure 5:
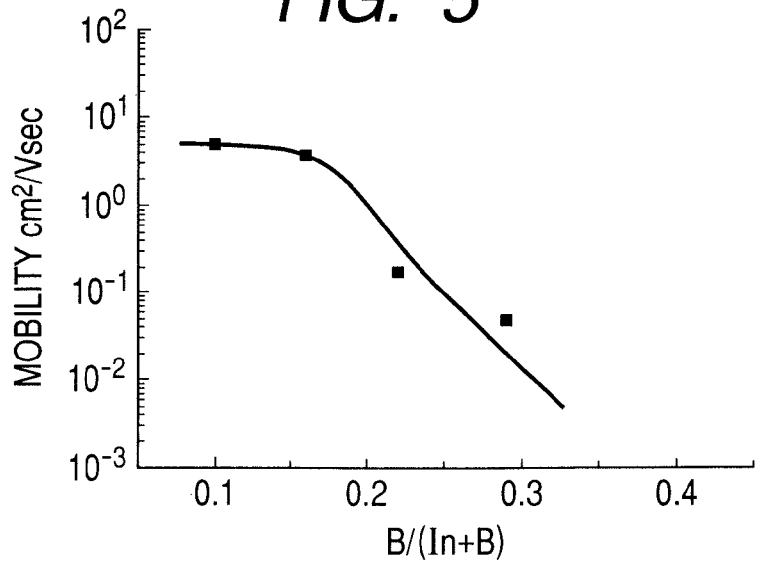
FIG. 5 is a graph illustrating element ratio B/(In+B) dependency of the field-effect mobility.

FIG. 5 is a graph illustrating an example of the dependency of field-effect mobility on the element ratio B/(In+B) when a field-effect transistor using an In—B—O thin film is manufactured. As is apparent from FIG. 5, the field-effect mobility becomes larger as the content of B reduces. A required value of the field-effect mobility depends on the use of the field-effect transistor. For example, an electrophoretic display can be driven by a TFT having a field-effect mobility of approximately 0.05 $cm^2/Vs$. A liquid crystal display can be driven by a TFT having a field-effect mobility of approximately 0.1 $cm^2/Vs$. In an organic EL display, a desirable field-effect mobility is equal to or larger than 1 $cm^2/Vs$. From this viewpoint, the element ratio B/(In+B) between In and B is desirably equal to or smaller than 0.29, more desirably equal to or smaller than 0.22, and most desirably equal to or smaller than 0.2.

Figure 6:
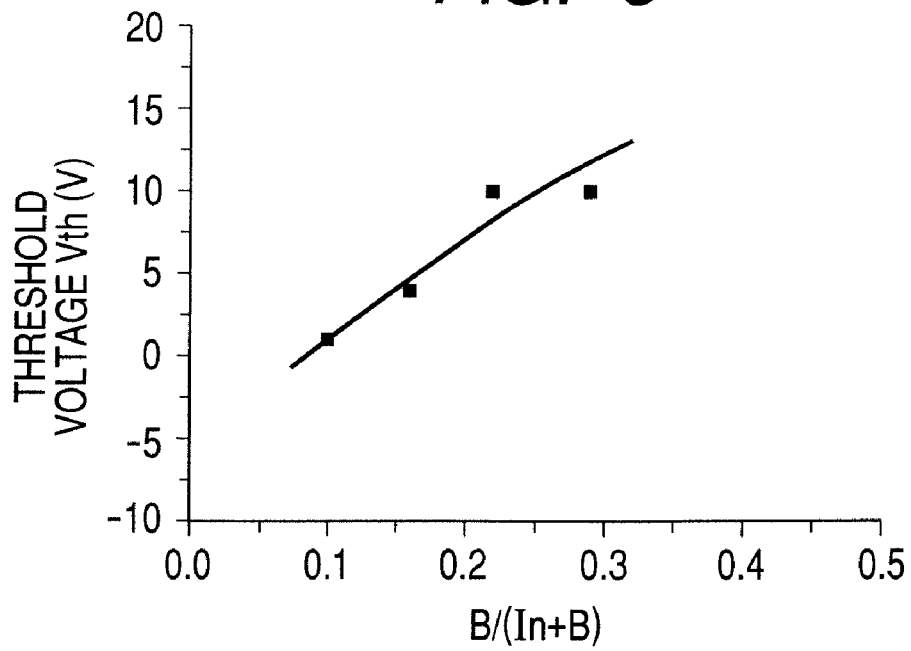
FIG. 6 is a graph illustrating element ratio B/(In+B) dependency of the threshold voltage.

FIG. 6 is a graph illustrating a result obtained by studying the composition dependency of the threshold voltage of an In—B—O based field-effect transistor. When the threshold voltage Vth of the In—B—O based field-effect transistor is equal to or larger than 0 V, a circuit is easily constructed. As illustrated in FIG. 6, the element ratio B/(In+B) is desirably equal to or larger than 0.1 because the threshold voltage Vth is positive in such case.

Figure 7:
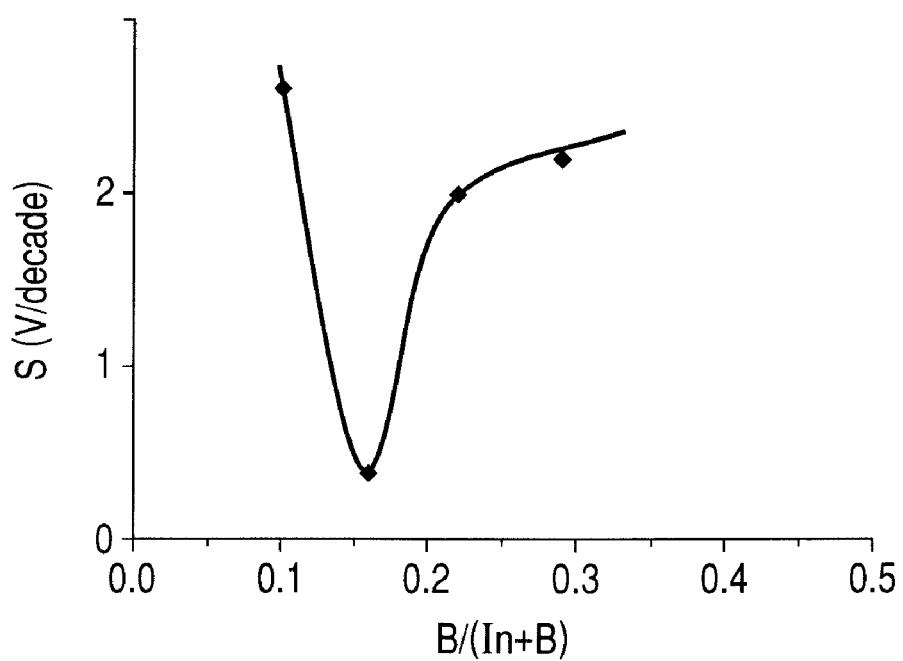
FIG. 7 is a graph illustrating element ratio B/(In+B) dependency of the S value.

FIG. 7 is a graph illustrating a result obtained by studying the transistor characteristic of an In—B—O based field-effect transistor. As illustrated in FIG. 7, when the element ratio B/(In+B) is set to a value equal to or larger than 0.12 and equal to or smaller than 0.2, a transistor having a smaller S value can be realized.

It is concluded from the above that, in employing In—B—O for a channel layer of a field-effect transistor, the element ratio B/(In+B) between In and B is desirably 0.05 or higher and 0.29 or lower, more desirably, 0.1 or higher and 0.22 or lower, and most desirably 0.12 or higher and 0.2 or lower.

The thickness of the oxide (channel layer) in this embodiment is desirably equal to or larger than 10 nm and equal to or smaller than 200 nm, more desirably equal to or larger than 20 nm and equal to or smaller than 70 nm, and most desirably equal to or larger than 25 nm and equal to or smaller than 40 nm.

Further, in order to obtain excellent TFT characteristics, the electrical conductivity of an amorphous oxide film used as the channel layer is desirably set to 0.000001 S/cm or more and 10 S/cm or less. When the electrical conductivity is larger than 10 S/cm, it is difficult to obtain a normally-off transistor and to increase the on/off ratio. In extreme cases, an application of gate voltage fails to turn on/off the current between the source and drain electrodes, and the TFT does not function as a transistor. On the other hand, when the electrical conductivity is smaller than 0.000001 S/cm, which makes the oxide film an insulator, it is difficult to increase the on-current. In extreme cases, an application of gate voltage fails to turn on/off the current between the source and drain electrodes, and the TFT does not function as a transistor.

Though the material composition of the channel layer is also a factor in obtaining the above-mentioned desirable range of electrical conductivity, the amorphous oxide film desirably has an electron carrier concentration of about $10^{14}$ to $10^{18}/cm^3$.

Figure 11:
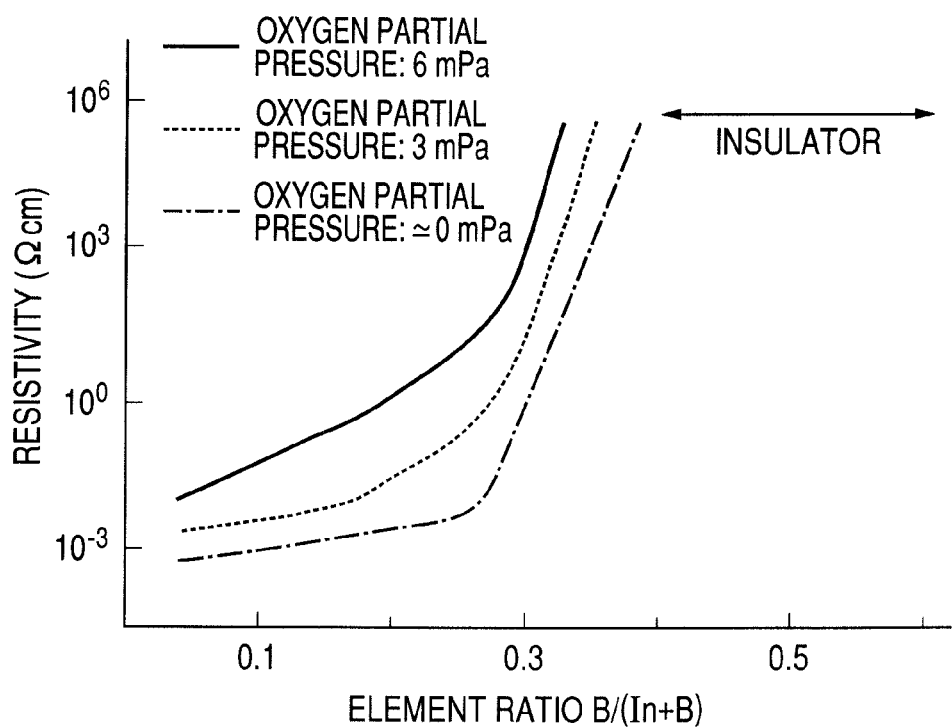
FIG. 11 is a graph illustrating element ratio B/(In+B) dependency of the resistivity of an In—B—O-based semiconductor thin film.

The electrical conductivity of the oxide applied to the channel layer can be controlled based on the composition ratio of metal elements, oxygen partial pressure during film deposition, and annealing conditions after thin film formation. FIG. 11 is a graph illustrating the dependency of the resistivity of an In—B—O semiconductor thin film on the element ratio B/(In+B). It is apparent that the electrical conductivity becomes smaller (resistivity thereof becomes larger) as the element ratio B/(In+B) increases. The oxygen partial pressure during film deposition is controlled to control mainly the amount of oxygen deficiency in the oxide semiconductor film, whereby the electron carrier concentration can be controlled. FIG. 11 illustrates electrical conductivities of thin films deposited by sputtering at difference oxygen partial pressures. It is apparent that the electrical conductivity becomes smaller as the oxygen partial pressure during film deposition increases.

As described above, the electrical conductivity can be controlled to some extent based on the film deposition conditions. However, there is limit to control the electrical conductivity, depending on the element ratio B/(In+B). For example, when the element ratio B/(In+B) is equal to or larger than 0.4, the thin film substantially becomes an insulator without depending on the oxygen partial pressure during film deposition. In a case where the element ratio B/(In+B) is equal to or smaller than 0.1, even when the oxygen partial pressure during film deposition increases, it is difficult to form semiconductive film having the electrical conductivity to a value equal to or smaller than 1 S/cm.

In this embodiment, in addition to In, B, and O, unavoidably contained elements or elements having contents not adversely affecting the characteristics are allowed as elements contained in the amorphous oxide.

(Gate Insulating Layer)

The material of the gate insulating layer 12 is not particularly limited as long as the material has excellent insulating property. However, it is desirable to use a thin film whose main ingredient is silicon because of excellent transistor characteristics. Though it is not clear exactly why the characteristics become excellent, the reason is considered to be that an excellent interface may be formed between the channel layer containing boron and the gate insulating layer whose main ingredient is silicon.

Specifically, desirable examples of the material whose main ingredient is silicon include a silicon oxide $SiO_x$, a silicon nitride $SiN_x$, and a silicon oxynitride $SiO_xN_y$. In addition, Si—B—O, Si—Hf—O, Si—Al—O, or Si—Y—O can be used as a complex oxide whose main ingredient is silicon.

By employing a thin film that has excellent insulating property as described above, the leak current can be reduced to about $10^{-11}$ amperes between the source and gate electrodes and between the drain and gate electrodes.

The thickness of the gate insulating layer is, for example, about 50 to 300 nm.

(Electrodes)

Each material of the source electrode 13, the drain electrode 14, and the gate electrode 15 is not particularly limited as long as excellent electrical conductivity can be obtained and electric connection to the channel layer is possible.

For example, a transparent conductive film of, for example, $In_2O_3$:Sn or ZnO, or a metal electrode of, for example, Au, Ni, W, Mo, Ag, or Pt can be used. Any layered structures including an Au—Ti layered structure are also employable.

(Substrate)

As the substrate 10, a glass substrate, a plastic substrate, a plastic film, or the like can be used.

The above-mentioned channel layer and the gate insulating layer are transparent with respect to visible light, and hence it is possible to obtain a transparent field-effect transistor by using a transparent material as each material of the above-mentioned electrodes and substrate.

As a method of depositing the above-mentioned oxide thin films, there is provided a gas phase process such as a sputtering method (SP method), a pulsed laser deposition method (PLD method), and an electron beam deposition method. It should be noted that, among the gas phase processes, the sputtering method is suitable from the viewpoint of productivity. However, the film deposition method is not limited to those methods. Further, the substrate temperature during film deposition can be maintained in a state where the substrate is not intentionally heated, in other words, substantially at room temperature. Accordingly, this method can be executed during a low-temperature process, and hence the field-effect transistor can be formed on the substrate such as a plastic plate or a foil.

Hereinafter, with reference to FIGS. 9A and 9B, characteristics of the field-effect transistor of this embodiment are described.

Figure 9A:
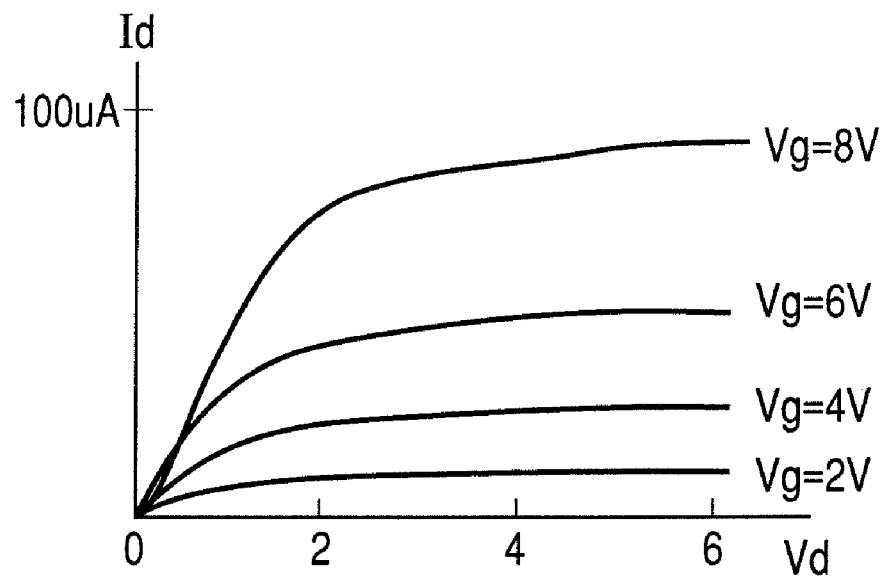
FIGS. 9A and 9B are graphs illustrating examples of characteristics of a field-effect transistor according to an embodiment of the present invention.
Figure 9B:
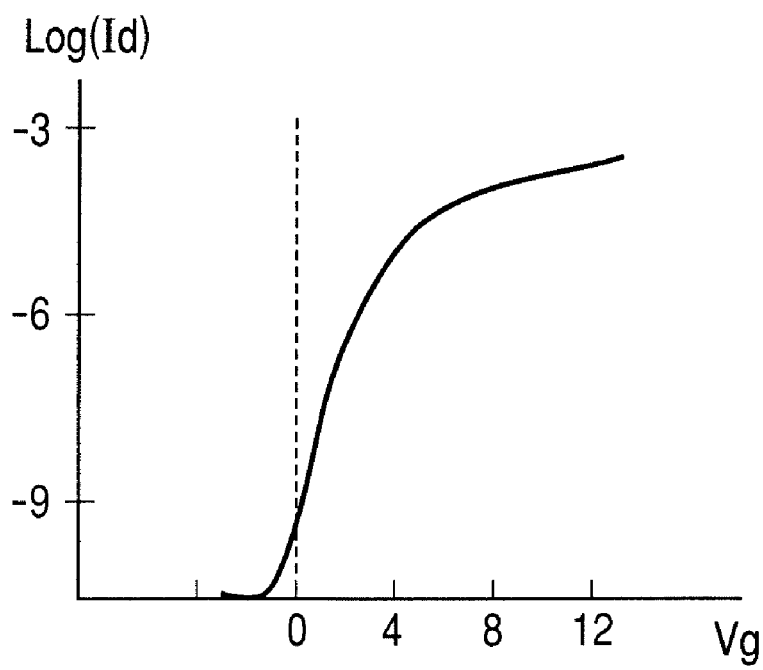

FIG. 9A illustrates an example of Id-Vd characteristics obtained at various gate voltages Vg, and FIG. 9B illustrates an example of Id-Vg characteristics (transfer characteristics) when Vd=6V. The difference in characteristics of the transistor can be expressed as a difference in field-effect mobility p, threshold voltage (Vth), on/off ratio, and S value.

The field-effect mobility can be obtained from characteristics of a linear region or a saturation region. For example, it is possible to employ a method of creating a graph representing $Id^{1/2}$-Vg from the results of the transfer characteristics so as to obtain the field-effect mobility from the slope of the graph. In the description of the present invention, unless otherwise noted, evaluation is performed by the method.

While there are provided some methods of obtaining the threshold value, the threshold voltage Vth can be obtained from, for example, the x-intercept of the graph representing $Id^{1/2}$-Vg.

The on/off ratio can be obtained from a ratio of the largest Id value to the smallest Id value in the transfer characteristics.

The S value can be obtained from the inverse number of the inclination of a graph representing Log(Id)-Vg which is created from the results of the transfer characteristics.

The difference in transistor characteristics is not limited to the above, but can be also represented by various parameters.

A semiconductor device like active matrix substrate is provided with the field-effect transistor according to this embodiment as described above. A transparent semiconductor device is provided with a transparent substrate and transparent amorphous oxide TFTs. Therefore, when the transparent active matrix substrate is applied to a display, the aperture ratio of the display can be increased. In particular, when the active matrix substrate is used for an organic EL display, a structure in which light is emitted from the substrate side (bottom emission) can be employed. The active matrix substrate provided with the field-effect transistor according to this embodiment may be used for various uses of, for example, an ID tag or an IC tag.

Hereinafter, a display is specifically described in detail as an example of the active matrix substrate provided with the field-effect transistor according to this embodiment.

A drain electrode which is an output terminal of the field-effect transistor according to this embodiment is connected with an electrode of a pixel device such as an organic or inorganic electroluminescence (EL) device or a liquid crystal device, whereby the display can be constructed. Hereinafter, a specific structural example of the display is described with reference to cross-sectional views illustrating the display.

Figure 12:
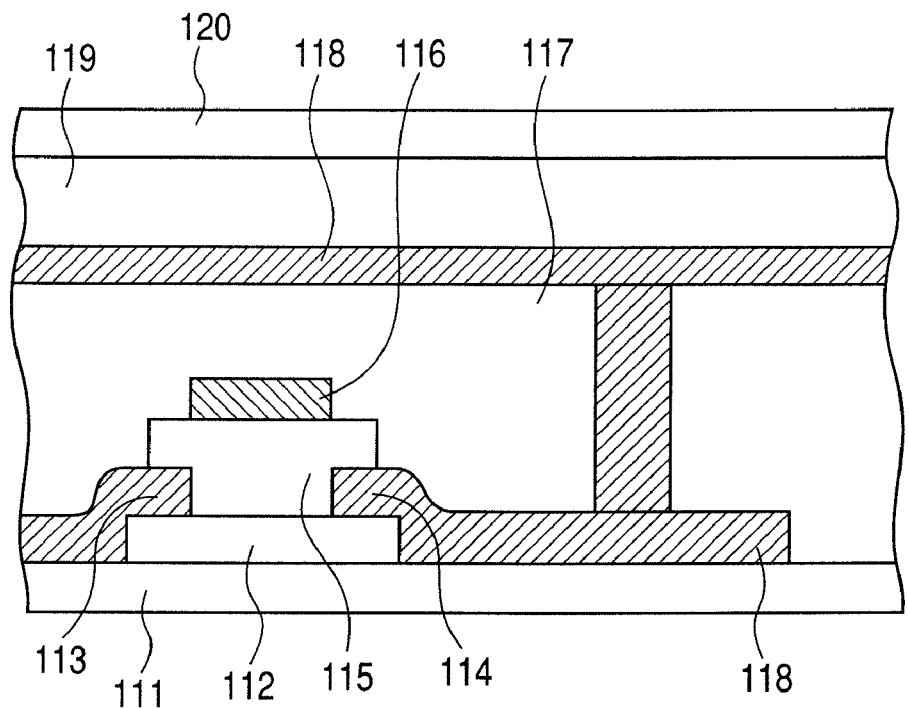
FIG. 12 is a schematic cross-sectional view illustrating an example of a display according to the present invention.

For example, as illustrated in FIG. 12, a field-effect transistor is formed on a base 111. The field-effect transistor is comprised of a channel layer 112, a source electrode 113, a drain electrode 114, a gate insulating layer 115, and a gate electrode 116. The drain electrode 114 is connected with an electrode 118 through an interlayer insulating layer 117. The electrode 118 is brought into contact with a light-emitting layer 119. The light-emitting layer 119 is brought into contact with an electrode 120. According to such a structure described above, the current injected to the light-emitting layer 119 can be controlled based on the value of the current flowing from the source electrode 113 to the drain electrode 114 through a channel formed in the channel layer 112. Therefore, the current can be controlled based on the voltage of the gate electrode 116 of the field-effect transistor. The electrode 118, the light-emitting layer 119, and the electrode 120 serve as an inorganic or organic electroluminescence device.

Figure 13:
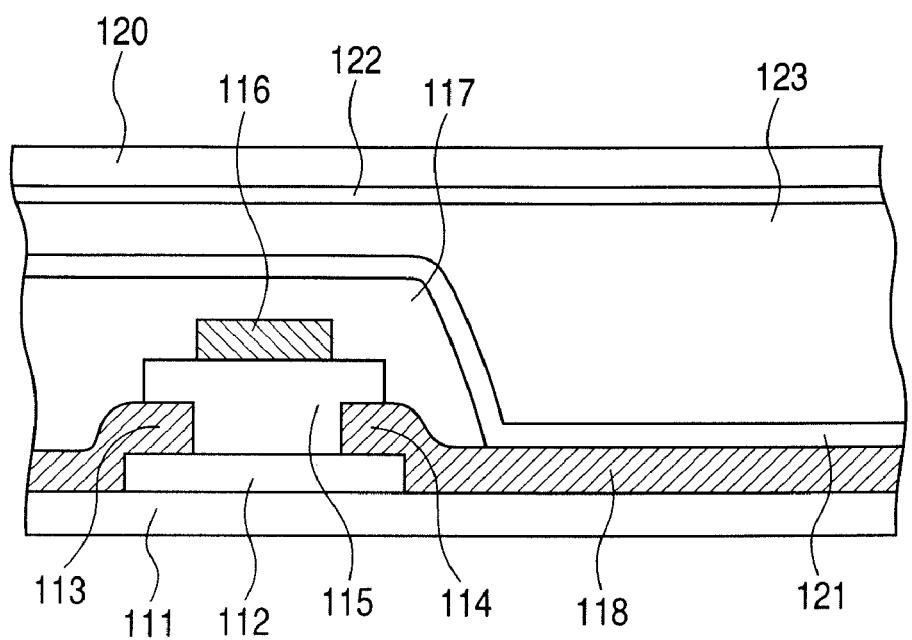
FIG. 13 is a schematic cross-sectional view illustrating another example of a display according to the present invention.

As illustrated in FIG. 13, a structure can be employed in which the drain electrode 114 is extended to also serve as the electrode 118 and thus used as the electrode 118 for applying a voltage to a liquid crystal cell or electrophoretic particle cell 123 sandwiched by high-resistance films 121 and 122. The liquid crystal cell or electrophoretic particle cell 123, the high-resistance films 121 and 122, and the electrodes 118 and 120 constitute a pixel device. The voltage applied to the pixel device can be controlled based on the value of the current flowing from the source electrode 113 to the drain electrode 114 through the channel formed in the channel layer 112. Therefore, the current can be controlled based on the voltage of the gate electrode 116 of the TFT. When the display medium of the pixel device is a capsule in which a fluid and particles are sealed within an insulating coating, the high-resistance films 121 and 122 are unnecessary.

In each of the two examples described above, the thin film transistor typically has a staggered structure (top-gate type). However, the present invention is not necessarily limited to such a structure described above. For example, when the drain electrode which is the output terminal of the thin film transistor and the pixel device are connected so as to be topologically identical, another structure such as a coplanar type can be employed.

In each of the two examples described above, the pair of electrodes for driving the pixel device is provided in parallel to the base. However, the present invention is not necessarily limited to such a structure described above. For example, when the drain electrode which is the output terminal of the thin film transistor and the pixel device are connected so as to be topologically identical, either one of the electrodes or both the electrodes may be provided perpendicular to the base.

In the case where the pair of electrodes for driving the pixel device are provided in parallel to the base, when the pixel device is an EL device or a reflection-type pixel device such as a reflection-type liquid crystal device, either one of the electrodes is necessary to be transparent with respect to a light emission wavelength or a wavelength of reflection light. When the pixel device is a transmission-type pixel device such as a transmission-type liquid crystal device, both the electrodes are necessary to be transparent with respect to transmission light.

The thin film transistor according to this embodiment can be comprised of all transparent constituent elements, and hence a transparent display can be formed. The display can be provided also on a low heat resistant base such as a plastic substrate which is light in weight, flexible, transparent.

Figure 14:
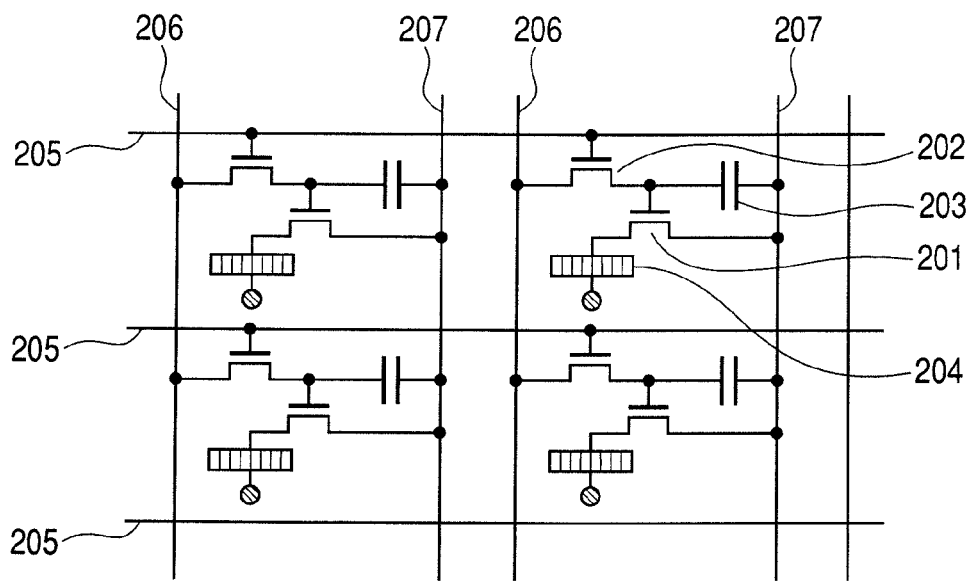
FIG. 14 is a schematic structural view illustrating a display in which pixels each including an organic EL device and a thin film transistor are two-dimensionally arranged.

Next, with reference to FIG. 14, a display in which multiple pixels each including an EL element (organic EL element in this embodiment) and a field-effect transistor are two-dimensionally arranged is described.

FIG. 14 illustrates a transistor 201 for driving an organic EL layer 204 and a transistor 202 for conducting pixel selection. A capacitor 203 is provided to hold selected conditions and stores charges between a common electrode line 207 and a source portion of the transistor 202, thereby holding a gate signal of the transistor 201. A pixel to be selected is determined by a scanning electrode line 205 and a signal electrode line 206.

More specifically, an image signal is applied as a pulse signal from a driver circuit (not shown) to the gate electrode through the scanning electrode line 205. Simultaneously, a pulse signal is applied from another driver circuit (not shown) to the transistor 202 through the signal electrode line 206 to select the pixel. At this time, the transistor 202 is turned ON, whereby charges are stored in the capacitor 203 located between the signal electrode line 206 and the source portion of the transistor 202. Then, the gate voltage of the transistor 201 is held to a desirable voltage to turn ON the transistor 201. This state is maintained until a next signal is received. During the state in which the transistor 201 is being turned ON, a voltage and a current are continuously supplied to the organic EL layer 204, thereby maintaining light emission.

FIG. 14 illustrates the structural example in which each pixel includes two transistors and one capacitor. But, in order to improve the performance, for example, a larger number of transistors may be incorporated in each of the pixels.

EXAMPLES

Described below are examples of the present invention. However, the present invention is not limited to the following examples.

Example 1

In this example, a top-gate TFT device illustrated in FIG. 8A was produced with an In—B—O-based amorphous oxide as a channel layer.

Figure 10:
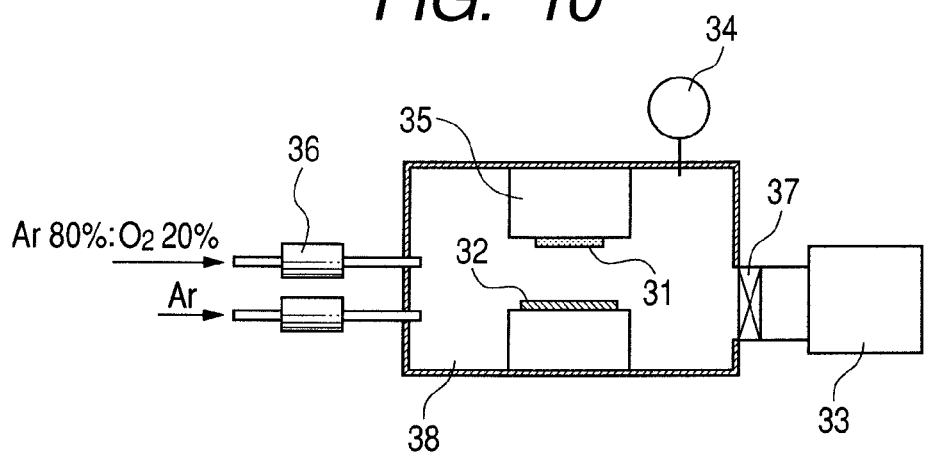
FIG. 10 is a diagram illustrating a structure of a thin film formation apparatus for manufacturing the field-effect transistor.

An In—B—O-based amorphous oxide film was formed first as the channel layer on a glass substrate (1737 manufactured by Corning Co.). Specifically, the In—B—O-based amorphous oxide film was formed by radio-frequency sputtering in a mixed atmosphere of argon gas and oxygen gas. At this time, a sputtering deposition apparatus as illustrated in FIG. 10 was used. In FIG. 10, a sample, a target, a vacuum pump, a vacuum gauge, and a substrate holder are denoted by reference numerals 31, 32, 33, 34, and 35, respectively. A gas flow rate controller 36 is provided for each gas introduction system. A pressure controller and a film deposition chamber are denoted by reference numerals 37 and 38, respectively. The vacuum pump 33 is an exhaust unit for exhausting the interior of the film deposition chamber 38. The substrate holder 35 is a unit for keeping the substrate on which the oxide film is to be formed within the film deposition chamber. The target (solid material source) 32 is placed opposing to the substrate holder. The deposition apparatus is further provided with an energy source (radio-frequency power source) (not shown) for causing the material to evaporate from the target 32 and a unit for supplying gas to the interior of the film deposition chamber.

The deposition apparatus has two gas introduction systems, one is for argon and the other is for a mixture gas of argon and oxygen ($Ar:O_2=95:5$). With the gas flow rate controllers 36, which enable the apparatus to control the respective gas flow rates individually, and the pressure controller 37, which is used to control the exhaust rate, a predetermined gas atmosphere can be obtained in the film deposition chamber.

In this example, as a target, 2-inch sized targets of $In_2O_3$ and $B_2O_3$ were used to form an In—B—O film by simultaneous sputtering. The input RF power was 70 W and 35 W for the respective targets. The atmosphere during the film deposition was set such that the total pressure was 0.4 Pa and the gas flow rate ratio was $Ar:O_2=100:1$. The film deposition rate and the substrate temperature were set to 12 nm/min and 25° C., respectively. After the film deposition, the film was subjected to an annealing process for 60 minutes at 300° C. in atmospheric air.

A grazing incidence X-ray diffraction analysis (thin film method, incident angle: 0.5°) was performed on the surface of the thus obtained film. No obvious diffraction peaks were detected, which indicated that the formed In—B—O-based film was an amorphous film.

A spectroscopic ellipsometry measurement was further conducted for pattern analysis, to reveal that the thin films had a roughness in root mean square (Rrms) of about 0.5 nm and a thickness of about 30 nm. An inductively coupled plasma emission spectroscopic method (ICP method) was used to analyze the metal composition ratio, to reveal that the metal composition ratio of the thin film was In:B=85:15. In other words, it was found that the element ratio B/(In+B) was 0.15.

The electrical conductivity, the electron carrier concentration, and the electron mobility were evaluated and estimated to be about $10^{-3}$ S/cm, $2\times10^{15}/cm^3$, and about 4 $cm^2/Vs$, respectively.

The drain electrode 14 and the source electrode 13 were next formed and patterned through photolithography and a lift-off method. The material of the electrodes was an Au—Ti layered film. The thickness of the Au layer was 40 nm and the thickness of the Ti layer was 5 nm.

The gate insulating layer 12 was next formed and patterned through photolithography and a lift-off method. The gate insulating layer 12 was an $SiO_2$ film deposited by sputter-deposition to a thickness of 150 nm. The specific dielectric constant of the $SiO_2$ film was about 3.7.

The gate electrode 15 was also formed through photolithography and a lift-off method. The channel length and the channel width were 50 μm and 200 μm, respectively. The material of the electrode was Au, and its thickness was 30 nm. A TFT was manufactured in the manner described above.

Next, characteristics of the TFT were evaluated.

FIGS. 9A and 9B illustrate examples of current-voltage characteristics of the TFT which were measured at room temperature. FIG. 9A illustrates Id-Vd characteristics whereas FIG. 9B illustrates Id-Vg characteristics. In FIG. 9A, the dependency of the source-drain current Id on the drain voltage Vd, which is caused by Vd variation, was measured under application of a constant gate voltage Vg. As illustrated in FIG. 9A, saturation (pinch off) was observed around Vd=6 V, which was a typical semiconductor transistor behavior. TFT characteristics were such that the threshold value of about 1.5 V at Vd=6 V. At Vg=10 V, a current of Id=about $1.0 \times 10^{-4}$ A flowed.

Further, the on/off ratio of the transistor exceeded $10^9$. The field-effect mobility calculated from output characteristics was about 2.5 $cm^2$/Vs in the saturation region.

The TFT manufactured in this example had excellent reproducibility, and fluctuations in characteristics in multiple devices manufactured were small.

As described above, when the novel amorphous oxide of In—B—O is applied for the channel layer, excellent transistor characteristics could be realized. In particular, there is an advantage that the number of constituent elements is smaller than in the conventional In—Ga—Zn—O-based oxide. Therefore, it can be expected to reduce a manufacturing load and a manufacturing cost.

Example 2

In this example, the In—B composition dependency was examined for a thin film transistor with a channel layer that contains In and B as major components.

This example employed a combinatorial method for film deposition in order to examine the material composition dependency of the channel layer. That is, the examination was conducted with the use of a method of forming, by sputtering, thin films of oxides having various compositions at once on a single substrate. However, it is not necessary to apply this combinatorial technique. A target (material source) of a desired composition may be prepared to deposit films for each composition. Also, films having various compositions may be formed by controlling the input powers for multiple targets separately.

An In—B—O film was formed with the use of a ternary grazing incidence sputtering apparatus. With the target obliquely positioned with respect to the substrate, the composition of a film on the substrate surface is varied due to the difference in distance from the target. As a result, a film having a wide compositional graduation on the substrate can be obtained. In forming the In—B—O film, two targets of $In_2O_3$ and one target of $B_2O_3$ were simultaneously subjected to sputtering. The input RF powers were respectively set to 35 W and 70 W. The atmosphere during the film deposition was set such that the total pressure was 0.35 Pa and the gas flow rate ratio was Ar:$O_2$=100:1. The substrate temperature was set to 25° C.

Physical properties of the thus formed film were evaluated by fluorescent X-ray analysis, spectroscopic ellipsometry, X-ray diffraction, and four-point probe resistivity measurement. Further, a combinatorial TFT library (TFTs with various channel compositions on a substrate) was manufactured by using an In—B—O compositionally graded film. TFT structure is a bottom-gate and top-contact type.

It was confirmed through an X-ray diffraction (XRD) measurement that the formed In—B—O film was amorphous in regions in which the element ratio B/(In+B) was 0.05 or higher. In some of film regions in which the element ratio B/(In+B) was smaller than 0.05, a diffraction peak of the crystal was observed. It was concluded from the above-mentioned results that an amorphous thin film could be obtained by setting the element ratio B/(In+B) in an In—B—O film to 0.05 or higher.

The sheet resistance of the In—B—O compositionally graded film was measured by a four-point probe method and the thickness of the film was measured by spectroscopic ellipsometry in order to obtain the resistivity of the film. As a result, as illustrated in FIG. 11, it was confirmed that the resistivity changed with the element ratio B/(In+B), and the resistance was found to be low on the Indium-rich composition (the composition in which the element ratio B/(In+B) was small) and high on the Boron-rich composition (the composition in which the element ratio B/(In+B) was large).

Further, the resistivity of the In—B—O compositionally graded film when the oxygen partial pressure in the film deposition atmosphere had been changed was obtained. It was found as a result that, as illustrated in FIG. 11, an increase in oxygen partial pressure raised the resistance of the In—B—O film. This is probably due to the lessening of oxygen deficiency and the resultant lowering of the electron carrier concentration. It was also found that the composition range in which the resistance was suitable for the TFT active layer changed in relation to the oxygen partial pressure.

Figure 15:
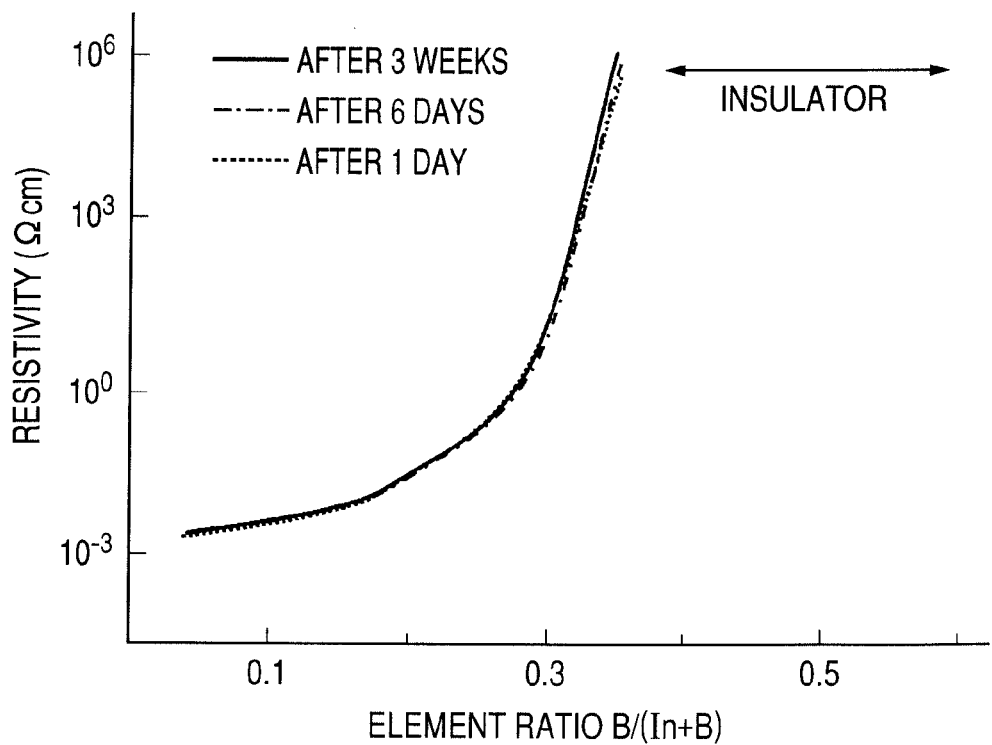
FIG. 15 is a graph illustrating a temporal change in resistivity of the In—B—O-based semiconductor thin film.

Results of measuring changes in resistivity of the In—B—O film with time are illustrated in FIG. 15. No changes in resistivity with time were observed in the In—B—O-based thin film over a wide composition range (range in which the element ratio B/(In+B) was 0.05 to 0.5). Further, FIG. 2 illustrates comparison of changes in resistivities with time among other materials. An In—Zn—O film and an In—Sn—O film that were formed in the same manner as the In—B—O film exhibited a tendency to decrease the resistivity with time. Those results proved that the In—B—O film had a superior environmental stability.

Next, characteristics and composition dependency of the field-effect transistor (FET) having the In—B—O film as the n-channel layer were examined. The transistor had a bottom-gate structure illustrated in FIG. 8C. Specifically, an In—B—O compositionally graded film was formed on an Si substrate having a thermal oxide film, and then patterning and electrode formation were performed, thereby forming on a single substrate devices including active layers having different compositions from one another. After the device formation, an annealing process was performed at 300° C. in atmospheric air. Many FETs were manufactured on a 3-inch wafer and evaluated in terms of characteristics. The FETs had a bottom-gate, top-contact structure that used $n^+$-Si for the gate electrode, $SiO_2$ for the insulating layer, and Au/Ti for the source and drain electrodes. The channel layer width and the channel layer length were 150 μm and 10 μm, respectively. The source-drain voltage used in the FET evaluation was 6 V.

In the TFT characteristics evaluation, the electron mobility was obtained from the slope of $Id^{1/2}$ (Id: drain current) with respect to the gate voltage (Vg), and the current on/off ratio was obtained from the ratio of the maximum Id value and the minimum Id value. The intercept with respect to the Vg axis when $Id^{1/2}$ was plotted in relation to Vg was taken as the threshold voltage, and the minimum value of dVg/d (log Id) was taken as the S value (voltage value necessary to increase the current by one order of magnitude).

Changes in TFT characteristics in relation to the element ratio B/(In+B) were examined by evaluating TFT characteristics at various positions on the substrate. It was found as a result that the TFT characteristics varied depending on the position on the substrate, namely, on the element ratio B/(In+B). Id-Vg characteristics in various compositions are illustrated in FIG. 4.

Figure 4:
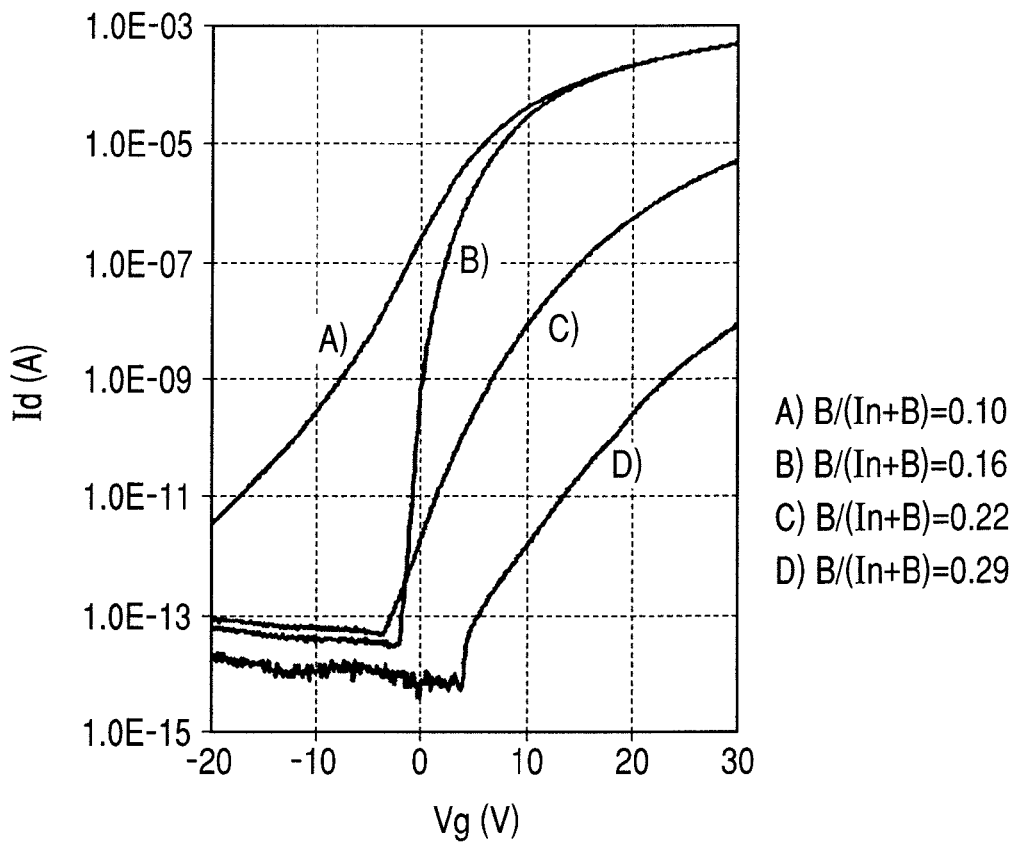
FIG. 4 is a graph illustrating transfer characteristics of In—B—O-based field-effect transistors having various element ratios B/(In+B).

In the case of an Indium-rich composition (for example, (A) of FIG. 4), the on-current is large and the off-current is relatively large. A device having the Indium-rich composition can be used for uses for which a large on-current is required. When a film having the element ratio B/(In+B) smaller than in the case of (A) of FIG. 4 is applied, the threshold value is negative.

In contrast to this, in the case of a Boron-rich composition (for example, (C) or (D) of FIG. 4), the on-current was relatively small, but the threshold voltage was positive, and hence a "normally-off characteristic" was obtained. A device having the Boron-rich composition can be used for uses for which a small off-current is required.

Figure 1:
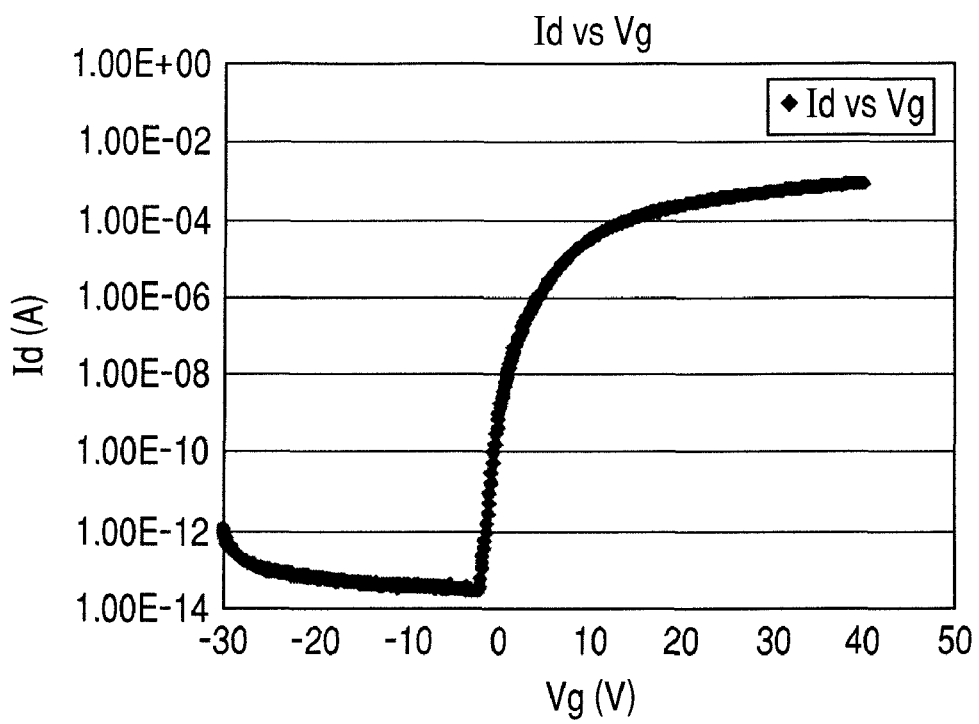
FIG. 1 is a graph illustrating a transfer characteristic of an In—B—O-based field-effect transistor.

A device in the case of (B) of FIG. 4 exhibited the most excellent characteristic. The characteristic of this device ((B) of FIG. 4) was singly illustrated also in FIG. 1. As illustrated in FIG. 1, the on/off ratio equal to or larger than ten orders of magnitude could be obtained in the case of the device having the element ratio B/(In+B) of 0.16 ((B) of FIG. 4). The S value was 0.4 V/decade, the field-effect mobility was 3 cm²/Vs, and the threshold value was 4 V.

FIG. 5 illustrates the element ratio B/(In+B) dependency of the field-effect mobility. It can be seen that the field-effect mobility increases as the Boron content is reduced. A field-effect mobility of 0.05 cm²/Vs or higher was obtained when the element ratio B/(In+B) was 0.29 or lower. Further, a field-effect mobility of 0.1 cm²/Vs or higher was obtained when the element ratio B/(In+B) was 0.22 or less, and 1 cm²/Vs or higher was obtained when the element ratio B/(In+B) was 0.2 or lower.

Further, FIG. 6 illustrates the element ratio B/(In+B) dependency of the threshold voltage. In general, a circuit is easily constituted when the threshold voltage Vth of a thin film transistor is 0 V or higher. As can be seen from FIG. 6, when the element ratio B/(In+B) is 0.1 or higher, Vth becomes positive.

FIG. 7 illustrates the element ratio B/(In+B) dependency of the S value. As is apparent from FIG. 7, when the element ratio B/(In+B) is equal to or larger than 0.12 and equal to or smaller than 0.2, a small S value is obtained, which is desirable.

In FIGS. 3A and 3B, the characteristics of the transistor in which In—Ga—O is applied to the channel layer are compared with the characteristics of the transistor in which In—Al—O is applied to the channel layer. A sample of the transistor in which In—Ga—O is applied to the channel layer and that of the transistor in which In—Al—O is applied to the channel layer were produced and evaluated as in the case of the transistor in which In—B—O is applied to the channel layer as described above. Of devices having various composition ratios between In and Ga (devices having various composition ratios between In and Al or Ga), devices exhibiting excellent transistor characteristics were picked out. The transistor characteristics to be compared were illustrated in FIGS. 3A and 3B. As illustrated in FIG. 3A, in combinations of In and one of B (boron), Al, and Ga which are group III elements, In—B—O exhibits the largest on/off ratio. As is apparent from FIG. 3B, when In—B—O is used, a transistor having the smallest S value can be realized. Therefore, it is apparent that, of the amorphous oxide semiconductors using two metal elements, In—B—O is excellent as the channel material of the TFT.

Example 3

In this example, a TFT device in which an amorphous In—Zn—B—O oxide semiconductor is applied to a channel layer was produced. The TFT had a structure illustrated in FIG. 8B.

A polyethylene terephthalate (PET) film was prepared as a substrate. The channel length and channel width of the transistor were 60 μm and 180 μm, respectively.

First, on this PET substrate 10, the gate electrode 15 was formed by photolithography and a lift-off method, and the gate insulating layer 12 was formed and patterned.

The gate electrode 15 was made of a Mo film with a thickness of 50 nm. The gate insulating layer 12 was an $SiO_x$ film deposited by sputtering to have a thickness of 150 nm. The specific dielectric constant of the $SiO_x$ film was about 3.7.

Next, the channel layer of the transistor was formed by sputtering and patterned through photolithography and a lift-off method. The channel layer was made of an In—Zn—B—O-based amorphous oxide, which contained In, Zn, and B at a composition ratio of In:Zn:B=4:6:1.

An In—Zn—B—O-based amorphous oxide film was formed by radio-frequency sputtering in a mixed atmosphere of argon gas and oxygen gas.

In this example, three targets (material sources) were used to form a film by simultaneous deposition. The three targets were respectively 2-inch sized, sintered materials of $In_2O_3$, $B_2O_3$, and ZnO. By controlling the input RF power for those targets separately, an oxide thin film having a desired In:Zn:B composition ratio was obtained. The atmosphere was set such that the total pressure was 0.5 Pa and the gas flow rate ratio was Ar:$O_2$=100:1. The substrate temperature was set to 25° C.

The thus formed oxide film was found to be an amorphous film because no obvious diffraction peaks were detected in X-ray diffraction (thin film method, incident angle: 0.5°). The thickness of the amorphous oxide film was about 30 nm.

An optical absorption spectrum analysis revealed that the formed amorphous oxide film had a forbidden band energy width of about 3 eV and was transparent with respect to visible light.

The source electrode, the drain electrode, and the gate electrode were made of a transparent conductive film comprised of $In_2O_3$:Sn, and each electrode had a thickness of 100 nm.

The thus manufactured TFT was evaluated in terms of characteristics.

The on/off ratio of the transistor of this example formed on the PET film measured and evaluated at room temperature exceeded $10^9$. The calculated field-effect mobility was about 5 cm²/Vs.

Further, the thin film transistor that employs In—Zn—B—O for the channel according to this example has high performance and high environmental stability.

Excellent transistor operation was ensured when the element ratio B/(In+Zn+B) of the amorphous oxide material was 0.05 or higher and 0.29 or lower.

The thin film transistor of this example which uses the In—Zn—B—O-based oxide semiconductor as the channel was also improved in environmental stability (characteristic fluctuations during storage in atmospheric air is small), compared to the thin film transistor that uses In—Zn—O containing no B as the channel.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-012592, filed Jan. 23, 2008, which is hereby incorporated by reference herein in its entirety.

The invention claimed is:

1. A field-effect transistor comprising at least a channel layer, a gate insulating layer, a source electrode, a drain electrode, and a gate electrode, which are formed on a substrate,
   wherein the channel layer comprises an oxide material that contains at least In and B, and
   wherein the oxide material has an element ratio B/(In +B) of 0.1 or higher and 0.29 or lower.

2. A field-effect transistor according to claim 1, wherein the element ratio B/(In +B) of the oxide material is 0.1 or higher and 0.22 or lower.

3. A field-effect transistor according to claim 2, wherein the element ratio B/(In +B) of the oxide material is 0.12 or higher and 0.2 or lower.

4. A field-effect transistor according to claim 1, wherein the gate insulating layer is made of a silicon oxide.

5. A field-effect transistor according to claim 4, wherein the channel layer and the gate insulating layer are deposited by sputtering.

6. A field-effect transistor according to claim 1,
   wherein the field-effect transistor is incorporated in a display that includes a pixel device, and
   wherein an electrode of the pixel device is connected with one of the source electrode and the drain electrode of the field-effect transistor.

7. A field-effect transistor according to claim 6, wherein the pixel device is an electroluminescence device.

8. A field-effect transistor according to claim 6, wherein the pixel device is a liquid crystal cell.

9. A field-effect transistor according to claim 6,
   wherein the pixel device is one of a plurality of pixel devices and the field-effect transistor is one of a plurality of field-effect transistors, and
   wherein the plurality of pixel devices and the plurality of field-effect transistors are two-dimensionally arranged on a substrate.

10. A field-effect transistor according to claim 1,
    wherein the oxide material is an amorphous oxide material.

* * * * *